United States Patent
Dielissen et al.

(10) Patent No.: US 7,219,288 B2
(45) Date of Patent: May 15, 2007

(54) RUNNING MINIMUM MESSAGE PASSING LDPC DECODING

(75) Inventors: Johannus Theodorus Matheus Hubertus Dielissen, Eindhoven (NL); Andries Pieter Hekstra, Eindhoven (NL); Josephus Antonius Huisken, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/536,226

(22) PCT Filed: Nov. 14, 2003

(86) PCT No.: PCT/IB03/05162

§ 371 (c)(1),
(2), (4) Date: May 24, 2005

(87) PCT Pub. No.: WO2004/049578

PCT Pub. Date: Jun. 10, 2004

(65) Prior Publication Data

US 2006/0156167 A1    Jul. 13, 2006

(30) Foreign Application Priority Data

Nov. 27, 2002    (EP) ................................. 02292938

(51) Int. Cl.
*H03M 13/00* (2006.01)

(52) U.S. Cl. .................. 714/752; 714/746; 714/755

(58) Field of Classification Search ................ 714/752, 714/746, 755, 794, 795, 799, 786, 791, 758, 714/801

See application file for complete search history.

(56) References Cited

U.S. PATENT DOCUMENTS

| | | | |
|---|---|---|---|
| 5,757,821 A * | 5/1998 | Jamal et al. ................. | 714/746 |
| 6,421,804 B1 * | 7/2002 | Lee .............................. | 714/755 |
| 6,633,856 B2 * | 10/2003 | Richardson et al. .......... | 706/15 |
| 6,857,097 B2 * | 2/2005 | Yedidia et al. .............. | 714/752 |
| 7,000,167 B2 * | 2/2006 | Coker et al. ................ | 714/752 |
| 7,020,829 B2 * | 3/2006 | Eroz et al. ................... | 714/794 |
| 7,031,090 B2 * | 4/2006 | Ichihara et al. ............... | 360/65 |
| 2003/0033575 A1 * | 2/2003 | Richardson et al. ........ | 714/799 |
| 2004/0044947 A1 * | 3/2004 | Becker et al. .............. | 714/795 |

OTHER PUBLICATIONS

"Reduced Complexity Iterative Decoding of Low-Density Parity Check Codes Based on Belief Propagation" by Marc P.C. Fossorier published in IEEE Transactions on Communications, vol. 47, No. 5, May 1999.
R.G. Gallagher, "Low density parity check codes," IRE Transactions on Information Theory IT-8, pp. 21-28, 1962.
"Factor Graphs and the Sum-Product Algorithm," IEEE Trans, on Information Theory, vol. IT-47, No. 2, Feb. 2001.
J. Hagenauer, E. Offer, L. Papke, "Iterative decoding of binary block and convolutional codes Information Theory," IEEE Transaction on Inforamtion Theory, vol. 42 No. 2, pp. 429-445, Mar. 1996.

* cited by examiner

*Primary Examiner*—Guy Lamarre
*Assistant Examiner*—Fritz Alphonse
(74) *Attorney, Agent, or Firm*—Michael E. Belk

(57) ABSTRACT

A decoding method for decoding Low-Density Parity Check codes in transmission and recording systems includes a running minimum loop with the following iterative acts: reading a reliability value from the input sequence of input reliability values; comparing the reliability value with a stored value; and overwriting the stored value with the reliability value if the reliability value is smaller than the stored value.

19 Claims, 1 Drawing Sheet

RUNNING MINIMUM MESSAGE PASSING LDPC DECODING

FIELD OF THE INVENTION

The invention relates to a decoding method for delivering soft-decision outputs from codeword symbols encoded with a Low-Density Parity Check (LDPC) code.

The invention applies to digital transmission and recording systems, such as in magnetic recording, optical recording, telecommunications (e.g mobile and optical networks), in-house radio-networks and systems that involve space-time coding, etc. It is particularly advantageous for two-dimensional optical storage, which is one of the potential technologies for the next generations of optical storage.

BACKGROUND ART

The article: "Reduced Complexity Iterative Decoding of Low-Density Parity Check Codes Based on Belief Propagation" by Marc P. C. Fossorier published in IEEE Transactions on Communications, vol. 47, No. 5, May 1999, [1] describes an iterative algorithm for decoding LDPC codes. LDPC codes are error-correcting codes of which the decoders can accept soft decision inputs. LDPC decoding does not involve Viterbi-kind of algorithms and is much less complex. LDPC codes were invented in the 1960s by Gallager. Later in the 1990s, Berrou et al. invented Turbo codes. Then, MacKay and others discovered that Turbo codes were similar to LDPC codes.

In the sequel, the abbreviation LDPC will be used to designate all codes with a Low-Density Parity Check matrix, including Turbo codes.

SUMMARY OF THE INVENTION

It is an object of the invention to provide a decoding method for LDPC codes that enables to save a significant amount of memory space in decoders.

In accordance with the invention, a decoding method for LDPC codes as mentioned in the opening paragraph is provided. Said LDPC codes are defined by a number of codeword symbols being checked by a number of parity check equations, each parity check equation being destined to check a limited number of codeword symbols and each codeword symbol being destined to be checked by a limited number of parity check equations. In accordance with the invention, the method comprises a step, denoted running minimum loop, of determining a minimum value from an input sequence of input reliability values associated to a set of codeword symbols checked by a same parity check equation, said running minimum loop comprising the following iterative sub-steps:

reading a reliability value from the input sequence of input reliability values,
comparing said reliability value with a stored value,
overwriting the stored value with said reliability value if said reliability value is smaller than said stored value.

Using such running minimum step for determining a minimum value from an input sequence of a plurality of input reliability values avoids storing the results of all comparisons. This is in practice more feasible on a single chip than storing all the comparison results.

In accordance with a particular embodiment of the invention, the method comprises a step of computing, for each parity check equation, an output sequence of output reliabilities from said input sequence of input reliabilities, each output reliability of the output sequence being equal to the minimum value of all input reliabilities except the one with the same index in the input sequence, said minimum value being determined with said running minimum step. In this particular case, all results in the output sequence, except the one having the index of the overall minimum value, are equal to the overall minimum value, the result having the index of the overall minimum value being equal to the second-to-minimum value. As a consequence, only three values need to be stored, that are the overall minimum value, the overall second-to-minimum value and the index of the overall minimum value in the input sequence.

In accordance with a preferred embodiment of the invention, the input sequence of input reliability values is produced from said codeword symbols received from a transmission channel or a recording channel. The input reliability values are derived from the absolute values of Log Likelihood Ratios (LLR) of the codeword symbols. In general, the LLR of a binary random variable X is defined as:

$$LLR_X = \log(Pr\{X=0\}/Pr\{X=1\}),$$

where $Pr\{X=0\}$ is the probability that $X=0$. Using Log Likelihood Ratios representations of probabilities enables the decoding algorithm to behave linearly in the input log-likelihoods that are received over the channel. This makes the decoding result less prone to degradation by errors in the knowledge of the signal to noise ratio.

The invention also relates to:
a receiver for receiving from a channel medium codeword symbols encoded with a Low-Density Parity Check code,
an optical storage medium for use in such a receiver,
a system comprising a source for delivering codeword symbols encoded with a Low-Density Parity Check code through a channel medium and a receiver for receiving said codeword symbols from the channel medium,
a computer program product for carrying out the decoding method,
a signal for carrying the computer program and
making available for downloading the computer program.

BRIEF DESCRIPTION OF THE DRAWINGS

The invention and additional features, which may be optionally used to implement the invention, are apparent from and will be elucidated with reference to the drawings described hereinafter and wherein.

DETAILED DESCRIPTION OF THE DRAWINGS

The following remarks relate to reference signs. Same block labels in all figures usually indicate same functional entities.

Before describing the core of the invention, a definition of LPDC codes to which the invention applies is given herein after. LDPC codes are sparse matrix error-correcting codes for use e.g. in digital transmission and recording systems. They proved to be very efficient in enabling the decoder to retrieve the original information delivered by the source. The parity check matrix H of an error-correcting code is a binary matrix such that Hc=0, if and only if c is a codeword. That is, the code space is the null space of matrix H. The "low density" property of the parity check matrices refers to the fact that if the block length (i.e. codeword length) of these codes goes to infinity, the number of 1's per row K and the number of 1's per column $J \geqq 3$ remain finite. The rate of an LDPC code equals R=1−J/K.

Gallager's construction method described in R. G. Gallager, "Low density parity check codes," IRE Transactions on Information Theory IT-8, pp. 21–28, 1962 [2] was used to create a parity check matrix H that has exactly J ones per column and exactly K ones per row. To date, more general constructions of LDPC codes are known. In these generalized LDPC codes the number of ones per row and per column may vary according to a certain probability distribution. The invention applies to both types of codes, as well as to Turbo codes, which have similar properties.

These codes are decoded using a so-called message-passing algorithm. When making an LDPC decoder chip, a disadvantage of the classical sum-product message-passing algorithm is that it involves quite a number of multiplications. To circumvent this complexity, a trick can be applied that is well known in the area of Turbo coding, called "approximation of the Box-function with the minimum reliability input". The Box function consists in replacing the reliability of the exclusive OR of two entities by a function of the reliabilities of both entities. Its approximation (letting aside the sign) consists in replacing the so-called Box function with the minimum of the absolute values of the reliabilities. The same approximation is used for the message-passing algorithm in accordance with the invention, wherein it turns out to have even more far-reaching positive consequences.

Figure 1:
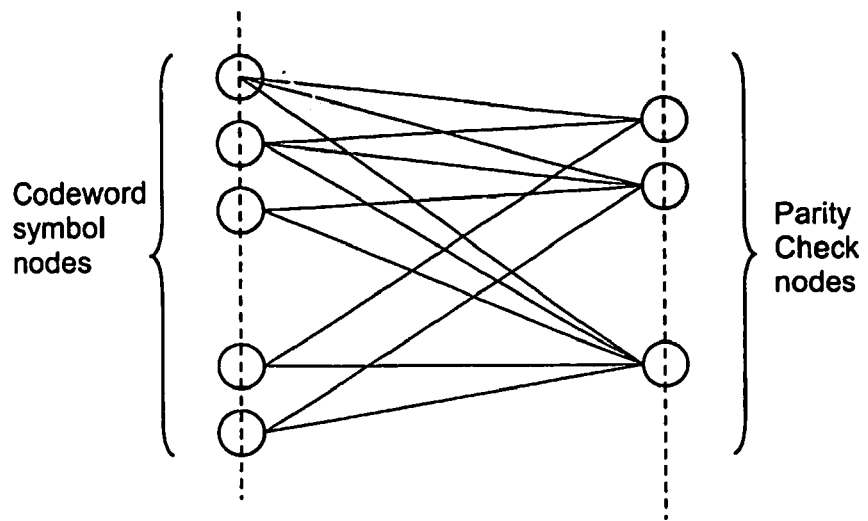
FIG. 1 is a conceptual diagram for illustrating an example of a method of decoding LDPC codes in accordance with a first embodiment of the invention.

FIG. 1 is a bi-partite LDPC graph, which is a graphical representation of the parity check matrix, for illustrating the so-called message-passing algorithm in accordance with the invention. The bipartite graph comprises two kinds of nodes at either sides of the graph. One kind of nodes on the left side is the codeword symbol nodes. They represent the input codeword symbols. The other kind of nodes on the right side is the parity check nodes. They represent the parity check equations. If a certain parity check equation parity checks K codeword symbols, these K codeword symbol nodes are linked with the pertaining parity check node in the graph. Thus, the degree of the parity check nodes (the number of edges connected) equals K. The degree of a codeword symbol node equals J because the number of 1's in a column of the parity check matrix H equals J.

For example, the length of an LDPC code such that its performance gets close to the Shannon capacity limit is e.g. ca. 10000 bits. For the intended application area of optical storage, a high rate code, e.g. rate 0,90 is required (it is to be noted that for low rate codes, e.g. rate 0,5 the invention is also advantageous). That means that there are (1−0.90)*10000=1000 parity check equations. The 10000 codeword symbols are represented by as many nodes on the left side of the bipartite graph. The 1000 parity check equations are represented by as many nodes on the right side of the graph. In between the left nodes and the right nodes edges are laid out. E.g. each left node is the end point of 3 edges (J=3), each right node is the end point of 30 edges (K=30) so that there are 3×10,000=30×1000 edges. This means that the sum of the 30 codeword symbols whose nodes are connected to a parity check node must add up (modulo 2) to zero; i.e. have predetermined parity. Each codeword symbol is incorporated in 3 check equations. More precisely, the codeword length (ca. 10000 in the example) should be a multiple of K, for Gallager codes.

Decoding on such a bipartite graph is done with the message-passing algorithm. The original LDPC message-passing algorithm is called the sum-product algorithm and is described in F. R. Kschischang, B. J. Frey, H. A. Loeliger, "Factor Graphs and the Sum-Product Algorithm," IEEE Trans. on Information Theory, Volume IT-47, No. 2, February 2001 [3]. The sum-minimum algorithm is a simplified multiplication-free variant of the sum-product algorithm. A standard implementation of either the sum-product or the sum-minimum algorithm goes as follows. Messages carrying probability information flow over the edges of the graph, alternatively, from the codeword nodes to the parity check nodes, and back.

In a typical implementation, e.g. all most recent outgoing messages (or all incoming messages, or both) are stored in the nodes. In the left nodes this leads to a storage requirement of at least 3 messages, of approximately one byte size each, for each of the 10 000 nodes. For the right nodes this leads to a storage requirement of at least 30 messages for each of the 1000 nodes. In total two times 30,000 messages are to be stored.

Before describing the algorithmic structure of LDPC decoding, the transformation from sum-product structure to a sum-minimum structure is explained herein after. This kind of transformation is used in many error corrector implementations, such as Viterbi and Turbo decoders. It usually makes use of log-likelihood ratio (LLR) representations of probabilities, but another representation could be used. In general, the LLR of a binary random variable X is defined as:

$$LLR_X = \log(Pr\{X=0\}/Pr\{X=1\}),$$

where Pr{X=0} is the probability that X=0.

If no information about X is available, and both values 0 and 1 are equally likely, then $LLR_X=0$. Generally, the more $LLR_X$ information about X is available, the more the absolute value of the $LLR_X$ will deviate from zero. To derive a hard decision value for X from the $LLR_X$, one only needs to consider the sign of LLR. If $LLR_X>0$, the value X=0 is more likely. If $LLR_X<0$, the value X=1 is more likely. Therefore, the operations that will be performed in the simplified decoding algorithm, that is, the sum-minimum algorithm, are:

summation of log-likelihoods (in the codeword symbol nodes), minimization of absolute values of log-likelihoods, with multiplication of the signs ±1 in the parity check nodes (the multiplication of the ±1 signs corresponds to taking the exclusive OR of the pertaining hard decision bits 0/1).

The decoding algorithm in accordance with a preferred embodiment of the invention uses such log-likelihood ratio representations of probabilities. It will thus behave linearly in the input log-likelihoods that are received over the channel. Actually, these log-likelihoods can be produced by a bit-detector, also called equalizer. If we multiply the input log-likelihoods of the decoding algorithm with a constant alpha, then all log-likelihoods no matter after how much iteration also scale up with the same alpha. Thus, this alpha has no influence on the signs of the log-likelihoods, and therefore also has no influence on hard decision values of codeword bits after all iterations are done. Such a scaling with an unknown alpha occurs, when the input log-likelihoods are normalized with the correct or incorrect signal to noise ratio of the channel. The sum-product algorithm would convert log-likelihood ratios back to probabilities, in some form, and thus be sensitive to errors in the estimate of the signal to noise ratio. Thus, the fact that the signal to noise ratio does not need to be known in our decoding algorithm, makes the decoding result less prone to degradation by errors in the knowledge of the signal to noise ratio. In addition, as will be explained further later, also the memory architecture will be greatly influenced, in a positive manner, by the use of a sum-minimum instead of a sum-product decoding algorithm.

In the bipartite graph of FIG. 1, different operations are used inside the codeword symbol nodes and the parity check nodes. In the codeword symbol nodes, the combined LLR of multiple independent (the assumed independence is an approximation, which holds only at the start of decoding a codeword, and becomes increasingly invalid) sources of information about the random variable equals the sum of the individual LLRs. In the parity check nodes, the LLR of an exclusive OR of multiple independent (again, the independence is only an approximation) binary random variables is a so-called Box function of the input LLRs. The so-called Box function is described for example in [3] and in J. Hagenauer, E. Offer, L. Papke, "Iterative decoding of binary block and convolutional codes Information Theory," IEEE Transaction on Information Theory, Volume 42 Number 2, pages 429–445, March 1996 [4]. A principle that the codeword symbol nodes and the parity check nodes have in common is that soft information that flows into a node over a certain edge, may certainly not contribute to the soft information that flows out of that node over the same edge.

The following is a pseudo code text of the sum-product algorithm. The algorithm works with LLRs, which alternatively flow from all codeword bit nodes over all edges to all parity check nodes, and back. To start the algorithm up, we assume that all zeroes LLR's have been sent by the parity check nodes and received by the codeword symbol nodes. Note, that for each codeword symbol node the corresponding channel LLR also is an incoming edge to that node.

---

"FOR 45 ITERATIONS DO"
  "FOR ALL CODEWORD BIT NODES DO"
    "FOR EACH INCOMING EDGE A"
      "SUM ALL INCOMING LLRs EXCEPT OVER A"
      "SEND THE RESULT BACK OVER A"
    "NEXT EDGE"
  "NEXT CODEWORD BIT NODE"
  "FOR ALL PARITY CHECK NODES DO"
    "FOR EACH INCOMING EDGE"
      "TAKE THE BOX FUNCTION OF ALL INCOMING LLRs EXCEPT OVER A"
      "SEND THE RESULT BACK OVER A"
    "NEXT EDGE"
  "NEXT PARITY CHECK NODE"
"NEXT ITERATION"

---

The soft output codeword symbols of the algorithm are equal to the sum of all incoming LLRs (channel LLR plus the edges coming in from the parity check nodes) in a codeword bit node. An initial investigation of the sum-product LDPC decoding algorithm shows that even after load balancing, an excessive amount of multiplications must be performed. Common sub-expression minimization can roughly halve this number, but this is still not sufficient.

In the sum-product algorithm, one has the choice to do a large number of table lookups of a certain so-called Box-function. Alternatively, one can use a probability difference representation of the likelihoods in the parity check nodes (see[3]) and do a large number of fixed point multiplications. A minimization operation is relatively cheap in hardware. On the other hand, carrying out multiplications or doing large number of fixed-point to fixed-point table lookups takes up much chip area and is much slower.

With the sum-minimum algorithm, e.g. with NJ/K=1000 parity check nodes (N=10000, J=3) we need to take the minimum and second to minimum of K=30 input terms per check node, for a total of up to e.g. 45 iterations per received codeword. This has turned out to be feasible on a single chip, which would not have been the case if we had had to do as many multiplications. In the sum-minimum algorithm, one parity check node operation amounts to the following. For each of the k=0, 1, . . . , K−1 parity check nodes with which it is connected:

compute the exclusive OR of all hard bits output by the connected codeword symbol nodes (as determined by the signs of the output log-likelihood ratios) except the k-th one, compute the minimum of all K absolute values of the log-likelihood ratios of the codeword bit nodes to which the parity check node is connected except the k-th one.

A cheap way (in hardware) to compute the K exclusive OR results is to compute the exclusive OR of all K input bits. Now, the exclusive OR of all K input bits except one can be obtained by taking the exclusive OR of the aforementioned total and taking the exclusive OR with the input bit that is to be let aside.

With respect to the K minima that have to be computed during a parity check node operation and in accordance with the principle mentioned above that soft information that flows into a node over a certain edge shall not contribute to the soft information that flows out of that node over the same edge, the invention takes into consideration the following. Consider the k-th input to the parity check node, and assume that its absolute value of the log-likelihood ratio is not the minimum of all K such inputs. Then, the minimum value of all K inputs except the k-th one, equals the overall minimum of the K values. In case, the k-th log-likelihood ratio does have the absolute minimum value of all K inputs, the minimum of the K inputs except the k-th one equals the second-to-minimum value.

As an example, suppose the 30 input reliabilities of a given right node at a given iteration are the input sequence of Table 1 below:

TABLE 1

| input sequence of input reliabilities | | | | | | | | | |
|---|---|---|---|---|---|---|---|---|---|
| 10.2 | 6.0 | 2.3 | 20.7 | 18.2 | 8.9 | 14.2 | 1.8 | 12.2 | 19.4 |
| 7.5 | 30.0 | 28.8 | 5.9 | 2.9 | 5.7 | 8.2 | 15.8 | 17.0 | 13.1 |
| 10.6 | 18.7 | 9.2 | 12.0 | 20.8 | 15.6 | 13.9 | 11.4 | 16.7 | 20.1 |

The minima of all input reliabilities except one, where the first one is omitted, then the second one, then the third one, etcetera, results in the output sequence of Table 2 below:

TABLE 2

| output sequence of output reliabilities | | | | | | | | | |
|---|---|---|---|---|---|---|---|---|---|
| 1.8 | 1.8 | 1.8 | 1.8 | 1.8 | 1.8 | 1.8 | 2.3 | 1.8 | 1.8 |
| 1.8 | 1.8 | 1.8 | 1.8 | 1.8 | 1.8 | 1.8 | 1.8 | 1.8 | 1.8 |
| 1.8 | 1.8 | 1.8 | 1.8 | 1.8 | 1.8 | 1.8 | 1.8 | 1.8 | 1.8 |

It is to be noted that the output sequence comprises only two different values. One is the overall minimum value and corresponds to the output result in every position except one and the other is the overall second-to-minimum value which index corresponds to the position of the overall minimum value in the input sequence. Thus, in a parity check node, the sequence of minima of K values except the k-th one, k=0, 1, ..., K−1 can be stored using only three numbers:

the overall minimum value,
the overall second-to-minimum value,
the index k for which the minimum input value occurs, Taking advantage of the observations made above in order to save memory space in decoders, the message-passing algorithm in accordance with the invention, can be summarized as follows. First, a minimum value shall be determined from an input sequence of input reliability values associated to a set of codeword symbols checked by a same parity check equation. Then, the method performs a so-called running minimum loop comprising the following iterative sub-steps:

reading a reliability value from the input sequence of input reliability values,
comparing said reliability value with a stored value,
overwriting the stored value with said reliability value if said reliability value is smaller than said stored value.

Using such so-called running minimum step avoids storing the results of all comparisons corresponding to Table 2. Instead, a running minimum is updated when the input reliabilities of the input sequence are read, which enables saving memory space. In practice, when starting the running minimum step, the initially stored value could be a pre-stored reference value, whose value has been chosen appropriately, and that is updated with values read from the input sequence. In subsequent loops, the stored value could be a reliability value, smaller than the initially stored value, overwritten from the input sequence, which is to be updated when the other reliability values are read from the input sequence. Despite the fact that the running minimum step described above relates to the running overall minimum value of the input sequence of reliabilities, a similar method can also be applied to determine both overall minimum and second-to-minimum values. In this case, the running minimum step comprises the following iterative sub-steps:

reading a reliability value from the input sequence of input reliability values,
comparing said reliability value with a first and second stored value,
overwriting the first stored value with said reliability value if said reliability value is smaller than said first and second stored value,
overwriting the second stored value with said reliability value if said reliability value is smaller than said second stored value and bigger than said first stored value.

It is to be noted that in the example described below with respect to FIG. 1, each input reliability value associated to a codeword symbol is derived from the parity checks operated on said codeword symbol.

In the particular case of a message-passing algorithm comprising a step of computing, for each parity check equation, an output sequence of output reliabilities from said input sequence of input reliabilities, each output reliability of the output sequence being equal to the minimum value of all input reliabilities except the one with the same index in the input sequence, the minimum value can be determined with said running minimum step. In this particular case, the invention may normally lead to store only three values in each symbol node, that are the overall minimum value, the overall second-to-minimum value and the index of the overall minimum value in the input sequence, because all results in the output sequence, except the one having the index of the overall minimum value, are equal to the overall minimum value, the result having the index of the overall minimum value being equal to the second-to-minimum value.

To implement the invention summarized hereinabove, the following remarks are made. The input sequence of input reliability values is normally produced from said codeword symbols received from a source. The source may be e.g. a transmission channel or a recording channel. As already mentioned, the input reliability-values may be derived from the absolute values of Log Likelihood Ratios of the codeword symbols or from other representation of the probabilities of the codeword symbols. The sum of all codeword symbols in the set, which are checked by a same parity check equation, has predetermined parity.

The behavior of the message-passing algorithm described above can be explained using FIG. 1. Information (e.g. received messages, or information derived from received messages) is stored in all nodes. Alternately, messages flow across all edges from left to right (one half-iteration). Then, messages flow across all edges from right to left (second half-iteration). In this figure, the fact that information is stored in both the codeword bit nodes and the parity check nodes is indicated with two intersections (dashed lines) of the graph. The codeword bit nodes are on the left side. The parity check nodes are on the right side. In reality, for a rate R=0.9, J=3 code, each codeword symbol node has J=3 connected edges, each parity check node has K=J/(1−R)=30 connected edges. The default way of message passing in an LDPC graph is to first use information stored in the codeword bit nodes to compute output messages that flow to the right of the graph. Then, use information (messages) stored in the parity check nodes to compute messages that all flow to the left side of the graph.

To take advantage of the invention enabling not storing all 30 values but only the minimum, the second-to-minimum, and the index, the incoming messages should be processed in a parity check node and the output messages that have been prepared should be stored. For this, as already mentioned, only three numbers per parity check node (and some bits) need to be stored. If the prepared output messages are also stored in the codeword symbol nodes, J=3 numbers would have to be stored per codeword bit node. The fact that there are 1/(1−R)=10 times more codeword symbol nodes than parity check nodes, and that a similar amount of data for each node are stored, makes evident that the storage requirements would be dominated by the codeword symbol nodes.

Figure 2:
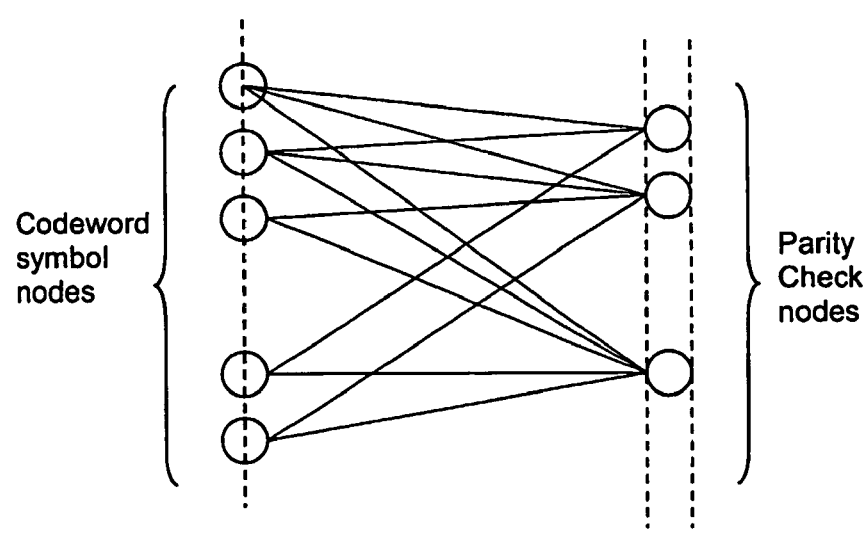
FIG. 2 is a conceptual diagram for illustrating an example of a method of decoding LDPC codes in accordance with a first embodiment of the invention.

FIG. 2 shows a bipartite graph in accordance with a preferred (more optimal) embodiment of the invention. In this embodiment, message information regarding the left nodes and message information regarding the right nodes are not stored to successively compute new right node information from the left node information and vice versa. Instead, the output message information of the parity check nodes are stored twice, one old (current) sequence of information, and one new sequence of information, which is in the process of being computed (from the old sequence). This time, the old output message information of the parity check nodes and a new sequence of the same information are stored. The computations can then be summarized as follows:

starting from the "current" values in the right nodes connected to a left node,
extracting the right node output messages from the minima, second to minima and the index and forward that information to a given left node (or a number of them), performing the left node processing and
immediately going back and incorporating the left node output messages that come from that left node in the (J=3) right nodes' "new" values, where running minima and running second to minima are maintained.

In the not optimal embodiment previously described, the storage requirement for the codeword symbol nodes was approximately 10 (=K/3) times larger than that of the parity check nodes. Now that all storage have been moved to the right side of the graph (the parity check nodes), a reduction in the storage requirement of roughly a factor of 10 can be obtained.

The running minimum algorithm enabling to save memory space in both the symbol nodes and the parity check nodes will now be described in more details with respect to the mentioned numerical example. For each of the ca. 10000 codeword symbols, one soft channel output (LLR), an 8 bit fixed point, has to be stored, which gives a storage requirement of 80 kbit. There are two sections in the parity check node memory: one section for all input values of an iteration, one section for all output values of an iteration. The input memory section and the output memory section are interchanged after one iteration, so that the former output now becomes input data.

For each of the 1000 parity check nodes, we thus have two copies of:

M, which denotes the running minimum of absolute log-likelihood inputs (a fixed point), MM, which denotes the running "second to minimum" absolute log-likelihood inputs (a fixed point), I, which denotes the index of which of K=30 absolute log-likelihood inputs is minimal (an edge label), T, which denotes 1 bit exclusive OR of all K=30 hard bit inputs, S[30], which denotes the sign bits of the K=30 inputs to check nodes, which makes in total, approximately 1000×2×(8+8+5+1+30 bit)=100 kbit. The total RAM storage requirement per LDPC decoder is ca. 80 kbit+ 100 kbit=180 kbit. Initially, in the input parity check node memory section, we replace all (M,MM,I,T,S) by (0,0, X,X,X[30]), where "X" denotes "don't care". The following is a pseudo code text of the so-called running minimum algorithm:

---

"FOR 45 ITERATIONS DO ..."
In the output parity check node memory section, set :
   (M, MM, I, T, S) = (MAX, MAX, X, 0, X[30])
where MAX denotes the maximum value in the fixed point representation used.
   "FOR ALL CODEWORD BIT NODES DO ..."

---

Fetch the J=3 inputs of that codeword symbol node. Each of the J=3 incoming branches, has a constant label (1 . . . 30=K), which represents the how many-th edge it is in its parity check node. For each of the J=3 incoming branches, if the I-field of the right node equals the constant label of the edge: fetch the second to minimum MM out of the input parity check node memory word, otherwise fetch the minimum M. M and MM are nonnegative reliabilities (absolute values of LLR's). Give the fetched reliability a sign bit equal to:

T+S[edge label]mod 2

(this way get the exclusive OR of all 30 hard bits except one). Sum the J=3 signed fetched numbers (these numbers are the input messages to the codeword bit node) and add the channel input value stored for that left node. From this total, for each of the J=3 edges, deduct the number fetched as input message for that edge. This way one gets J=3 partial sums, these are the J=3 outputs, that are sent to the parity check nodes. Send the J=3 outputs back to the corresponding output parity check nodes: For each of the J=3 edges of the left node that is being considered, check whether the absolute value of the output message is less than M. If so, MM is replace by M, and M is replaced by the pertaining output message of the codeword bit node, and replace the index I by the constant label of that edge. Otherwise, check whether the absolute value of the output is less than the second to minimum MM. If so, replace MM by the absolute value of the output message of the codeword bit node. Replace the T bit with an exclusive OR of the T bit and the hard decision bits of the pertaining output message.

"NEXT CODEWORD BIT NODE"

Exchange input and output parity check node memory section. Do the next iteration.

"NEXT ITERATION"

Ready, when some stop condition is met. Examples of a stop condition can be e.g. to include a cyclic redundancy check CRC on the message or codeword, and stop if the CRC checks positive, or stop if none of the decoded symbols which are then computed every iteration haven't changed with respect to the previous iteration.

The message passing decoding method described above can be implemented in a receiver, e.g. an optical reader, using a computer program to carry out the decoding method.

Figure 3:
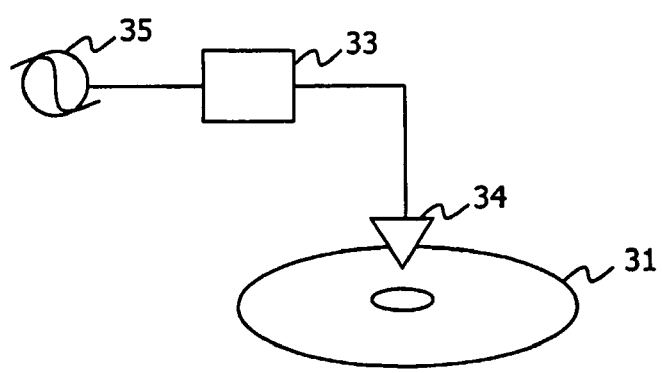
FIG. 3 is a schematic block diagram for illustrating an example of a system comprising a receiver in accordance with the invention.

FIG. 3 illustrates an example of an optical system in accordance of the invention. It comprises a data source and a receiver. The data source is a storage medium 31, e.g. an optical disk, wherein digital encoded data are stored. The receiver is an optical reader for reading and decoding the encoded data stored on the optical disk. The reader comprises a decoder 33, for implementing the decoding method as described with reference to FIG. 1 or FIG. 2, and optical reading means 34 to read the encoded data before decoding. The decoded data are then directed to an output 35 of the receiver for being treated.

The invention also applies in the case the codeword symbols are non-binary, but e.g. integers modulo q, q>2, or more generally elements of a mathematical object called a ring, or elements of a Galois Field.

The LDPC decoder can also be part of a Turbo demodulation scheme, in which there is no simple concatenation of a bit-detector and an LDPC decoder, but iterations of the bit-detector and iterations of the LDPC type are mixed in one big loop The drawings and their description herein before illustrate rather than limit the invention. It will be evident that there are numerous alternatives, which fall within the scope of the appended claims. In this respect, the following closing remarks are made.

There are numerous ways of implementing functions by means of items of hardware or software, or both. In this respect, the drawings are very diagrammatic, each representing only one possible embodiment of the invention. Thus, although a drawing shows different functions as different blocks, this by no means excludes that a single item of hardware or software carries out several functions. Nor does it exclude that an assembly of items of hardware or software, or both carries out a function.

CITED REFERENCES, THE DESCRIPTIONS IN [2], [3] AND [4] BEING HEREIN INCORPORATED BY REFERENCE

[1] Marc P. C. Fossorier, "Reduced Complexity Iterative Decoding of Low-Density Parity Check Codes Based on Belief Propagation" published in IEEE Transactions on Communications, vol. 47, No. 5, May 1999
[2] R. G. Gallager, "Low density parity check codes," IRE Transactions on Information Theory IT-8, pp. 21–28, 1962
[3] F. R. Kschischang, B. J. Frey, H. A. Loeliger, "Factor Graphs and the Sum-Product Algorithm," IEEE Trans. on Information Theory, Volume IT-47, No. 2, February 2001
[4] J. Hagenauer, E. Offer, L. Papke, "Iterative decoding of binary block and convolutional codes Information Theory," IEEE Trans. on Information Th., Vol. 42 Nr. 2, pp. 429–445, March 1996

The invention claimed is:

1. A decoding method for delivering soft-decision outputs from codeword symbols encoded with a Low-Density Parity Check code, said code comprising a number of codeword symbols checked by a number of parity check equations, wherein each parity check equation checks a limited number of codeword symbols and each codeword symbol is checked by a limited number of parity check equations, the method comprising the acts of:
   determining a minimum value from an input sequence of input reliability values associated with a set of codeword symbols checked by a same parity check equation; and
   forming an output sequence including output reliability values associated with the input reliability values, the output reliability values including only the minimum value, and a next minimum value being a second smallest value of the input reliability values and being located at an output location in the output sequence corresponding to an input location of the minimum value in the input sequence;
   wherein the determining act includes sub-acts of:
   reading a reliability value from the input sequence of input reliability values,
   comparing said reliability value with a stored value, and
   overwriting the stored value with said reliability value if said reliability value is smaller than said stored value.

2. The decoding method as claimed in claim 1, wherein said determining act a preliminary act of storing at least a reference value.

3. The decoding method as claimed in claim 1, wherein said input sequence of input reliability values is produced from said codeword symbols received from a transmission channel or a recording channel.

4. The decoding method as claimed in claim 3, wherein said input reliability values are derived from the absolute values of Log Likelihood Ratios of the codeword symbols received from the channel.

5. A receiver for receiving from a channel medium codeword symbols encoded with a Low-Density Parity Check code, the receiver comprising a decoder for carrying out the method as claimed in claim 1.

6. The receiver as claimed in claim 5, for use in a recording system.

7. A system comprising a source for delivering codeword symbols encoded with a Low-Density Parity Check code through a channel medium and the receiver as claimed in claim 5 for receiving said codeword symbols from the channel medium.

8. A storage medium for storing codeword symbols to be processed in accordance with the method as claimed in claim 1.

9. A computer program product for a receiver computing a set of instructions which when loaded into the receiver causes the receiver to carry out the method as claimed in claim 1.

10. A signal for carrying a computer program, the computer program being arranged to carry out the method as claimed in claim 1.

11. The decoding method of claim 1, further comprising the act of representing the output sequence by only the minimum value, the next minimum value, and an index associated with the input location of the minimum value in the input sequence.

12. The decoding method of claim 1, further comprising the act of storing only the minimum value, the next minimum value, and an index associated with the input location of the minimum value in the input sequence.

13. A decoding method for delivering soft-decision outputs from codeword symbols encoded with a Low-Density Parity Check code, said code comprising a number of codeword symbols checked by a number of parity check equations, wherein each parity check equation checks a limited number of codeword symbols and each codeword symbol is checked by a limited number of parity check equations, the method comprising the acts of:
   determining minimum values from an input sequence of input reliability values associated with a set of codeword symbols checked by a same parity check equation; and
   forming an output sequence including output reliability values associated with the input reliability values, the output reliability values including only the minimum value, and a next minimum value being a second smallest value of the input reliability values and being located at an output location in the output sequence corresponding to an input location of the minimum value in the input sequence;
   wherein the determining act includes sub-acts of:
   reading a reliability value from the input sequence of input reliability values,
   comparing said reliability value with a first and second stored value,
   overwriting the first stored value with said reliability value if said reliability value is smaller than said first and second stored value,
   overwriting the second stored value with said reliability value if said reliability value is smaller than said second stored value and bigger than said first stored value.

14. The decoding method of claim 13, further comprising the act of representing the output sequence by only the minimum value, the next minimum value and an index associated with the input location of the minimum value in the input sequence.

15. The decoding method of claim 13, further comprising the act of storing only the minimum value, the next minimum value and an index associated with the input location of the minimum value in the input sequence.

16. A decoding method for delivering soft-decision outputs from codeword symbols encoded with a Low-Density Parity Check code, said code comprising a number of codeword symbols checked by a number of parity check equations, wherein each parity check equation checks a limited number of codeword symbols and each codeword symbol is checked by a limited number of parity check equations, the method comprising the act of:
  determining a minimum value from an input sequence of input reliability values associated with a set of codeword symbols checked by a same parity check equation; and
  computing, for each parity check equation, an output sequence of output reliabilities from said input sequence of input reliabilities, each output reliability of the output sequence being equal to the minimum value of all input reliabilities except for one output reliability value at an output location in the output sequence corresponding to an input location of the minimum value in the input sequence.

17. The decoding method of claim 16, wherein the one output reliability value at the output location is a next minimum value being a second smallest value of the input reliability values.

18. A method for decoding an input sequence of input values comprising the acts of:
  determining a first minimum value and a second minimum value of the input values, the second minimum value being a second smallest value of the input values; and
  forming an output sequence including only the first minimum value arid the second minimum value, the second minimum value being at an output location in the output sequence associated with an input location of the first minimum value in the input sequence.

19. The method of claim 18, further comprising the act of representing the output sequence by only the first minimum value, the second minimum value and an index associated with the input location of the first minimum value in the input sequence.

* * * * *